US007389012B2

(12) United States Patent
Oggioni et al.

(10) Patent No.: US 7,389,012 B2
(45) Date of Patent: Jun. 17, 2008

(54) ELECTRO-OPTICAL MODULE COMPRISING FLEXIBLE CONNECTION CABLE AND METHOD OF MAKING THE SAME

(75) Inventors: Stefano S. Oggioni, Milan (IT); Bert J. Offrein, Schoenenberg (CH)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 10/904,271

(22) Filed: Nov. 2, 2004

(65) Prior Publication Data

US 2006/0093259 A1 May 4, 2006

(30) Foreign Application Priority Data

Dec. 30, 2003 (EP) .................................. 03368131

(51) Int. Cl.
 G02B 6/12 (2006.01)
(52) U.S. Cl. .............................. 385/14; 385/15; 257/778; 361/749; 174/260
(58) Field of Classification Search ............. 385/14–15, 385/88, 92, 129, 130, 131, 132, 89; 438/27; 340/604; 324/690; 257/696, 778; 174/260; 361/749; 357/778
See application file for complete search history.

(56) References Cited

U.S. PATENT DOCUMENTS

| 5,546,281 | A | * | 8/1996 | Poplawski et al. | .......... 361/752 |
|---|---|---|---|---|---|
| 5,742,480 | A | * | 4/1998 | Sawada et al. | .............. 361/749 |
| 6,140,707 | A | * | 10/2000 | Plepys et al. | ................. 257/778 |
| 6,246,330 | B1 | * | 6/2001 | Nielsen | ....................... 340/604 |
| 6,613,597 | B2 | * | 9/2003 | Stack | ........................... 438/27 |
| 6,617,525 | B2 | * | 9/2003 | Briar et al. | .................... 174/260 |
| 6,792,171 | B2 | * | 9/2004 | Hargis et al. | ................... 385/14 |
| 6,879,032 | B2 | * | 4/2005 | Rosenau et al. | ............. 257/696 |
| 6,892,449 | B1 | * | 5/2005 | Brophy et al. | ................. 29/827 |
| 6,930,494 | B2 | * | 8/2005 | Tesdahl et al. | .............. 324/690 |
| 7,036,999 | B2 | * | 5/2006 | Schrodinger | .................. 385/88 |
| 2004/0258367 | A1 | * | 12/2004 | Weigert et al. | ................ 385/89 |
| 2005/0244095 | A1 | * | 11/2005 | Ellison | ........................ 385/14 |

FOREIGN PATENT DOCUMENTS

DE 19917554 A1 11/2000
JP 4-74882 6/1992

* cited by examiner

Primary Examiner—K. Cyrus Kianni
Assistant Examiner—Guy G Anderson
(74) Attorney, Agent, or Firm—Steven Capella

(57) ABSTRACT

An electro-optical module comprising flexible connection cable and aligning capabilities is disclosed. Electro-optical devices may be soldered on a transparent substrate such as glass or a substrate comprising an optical waveguide wherein electrically conductive traces are designed, forming an electro-optical module. When such electro-optical module is inserted and aligned into a printed circuit board, the external part of the substrate, comprising electrically conductive traces and pads, referred to as flex-cable, is bent down toward the mounting plane of the PCB allowing to establish electrical connections between these pads and the PCB. The substrate may be brokenalong a pre-formed groove, and the external part of the substrate can be removed leaving the flex-cable section in place.

5 Claims, 3 Drawing Sheets

(a)

(b)

(c)     (d)

ELECTRO-OPTICAL MODULE COMPRISING FLEXIBLE CONNECTION CABLE AND METHOD OF MAKING THE SAME

FIELD OF THE INVENTION

The present invention relates generally to optical communication apparatus and more specifically to the implementation of optical interconnect links in printed circuit boards.

BACKGROUND OF THE INVENTION

Typically systems that might potentially use optical interconnects within the next few years are servers, supercomputers and telecom switch-routers, comprising multiple racks, wherein each rack has a backplane or midplane, and multiple plug-in cards (or blades). Communication between the plug-in-cards is routed through the backplane. The aggregate data rate within a single rack is expected to reach multiple Terabit per second (Tb/s) by the end of the decade, and it is assumed that it will grow to tens of Tb/s in the future. Currently communication is achieved electrically through copper lines. However, in electrical lines the attenuation and cross-talk increase with frequency. For board to board interconnects with a typical distance of one meter the crossover point where optical transmission becomes more power efficient than electrical transmission is at 5 Gb/s. Furthermore, optical transmission lines can be packed much denser than electrical lines.

The reliable, accurate and cost-effective integration of optical elements such as waveguides, transmitters and detectors in PCB's is a challenge lying mainly in high integration and optical alignment. The alignment requirements of optical elements are much tighter than those of electrical components. For example, the minimum alignment tolerance in the realization of a printed circuit board is 20 μm, optical elements need to be positioned with an accuracy of 5 μm (for 50 μm×50 μm square optical waveguides). Consequently, it is a challenge to align optical elements in a printed circuit board.

SUMMARY OF THE INVENTION

Thus, it is a broad object of the invention to remedy the shortcomings of the prior art as described here above.

It is another object of the invention to provide a high integration electro-optical module.

It is a further object of the invention to provide a method and system for aligning high integration electro-optical modules.

It is still a further object of the invention to provide a method and system for manufacturing high integration electro-optical modules.

To accomplish these and other related objects, the invention provides an electro-optical module adapted to be connected to a printed circuit board, the electro-optical module comprising a stiffener with at least one electrically conductive trace, characterized in that a portion of the stiffener, comprising a portion of the at least one electrically conductive trace, is removable and adapted to establish an electrical contact between the electro-optical module and the printed circuit board.

The invention also encompasses a method for manufacturing an electro-optical module adapted to be connected to a printed circuit board, the electro-optical module comprising a stiffener with at least one electrically conductive trace, a portion of the stiffener comprising a portion of the at least one electrically conductive trace being removable and adapted to establish an electrical contact between the electro-optical module and the printed circuit board, the method comprising the steps of:

coating dielectric material on top side of the electro-optical module, depositing and patterning of metal material, applying second layer of dielectric material, and, opening the second layer of dielectric material at predetermined positions.

The invention further encompasses a method for mounting an electro-optical module adapted to be connected to a printed circuit board, the electro-optical module comprising a stiffener with at least one electrically conductive trace, a portion of the stiffener comprising a portion of the at least one electrically conductive trace being removable and adapted to establish an electrical contact between the electro-optical module and the printed circuit board, the printed circuit board having a mounting plane comprising a cavity adapted to insert partially the electro-optical module, the method comprising the steps of:

inserting, aligning, and fastening the electro-optical module in the cavity of the printed circuit board, bending down the portion of the stiffener comprising a portion of the at least one electrically conductive trace toward the mounting plane, establishing an electrical connection between the at least one electrically conductive trace of the portion and the mounting plane.

These and other aspects of the invention are described in further detail below.

BRIEF DESCRIPTION OF THE DRAWINGS

FIGS. 3a, 3b, 3c, and 3d, illustrates an example of an electro-optical module according to the invention.

DETAILED DESCRIPTION OF THE INVENTION

The present invention introduces a design technique to be used in manufacturing a highly integrated electro-optical module with very small dimensions. According to the invention there is provided means for manufacturing, aligning, and connecting such modules. The number of precise alignment steps, where optics is engaged with the board, is reduced to an absolute minimum, one.

For sake of illustration the description is based upon Vertical Cavity Surface-Emitting Laser (VCSEL) as well as the associated optical signal detector that need to be assembled into small cavities like the one that can be created into optical back-planes or can be used to connect electrical signals to Micro ElectroMechanical Systems (MEMS) or Micro Opto-ElectroMechanical Systems (MOEMS).

These modules are designed to allow assembling of one or more devices onto a thermally stable structure with high performance electrical properties. The mounting operations are performed on flat surfaces to make these operations compatible with most of the industrial infrastructure already available and with no added costs. The modules can be folded and assembled in 3D shapes based on the system requirements with simple operation of breaking and removing the rigid stiffener that is used to assemble the module itself.

Figure 1:
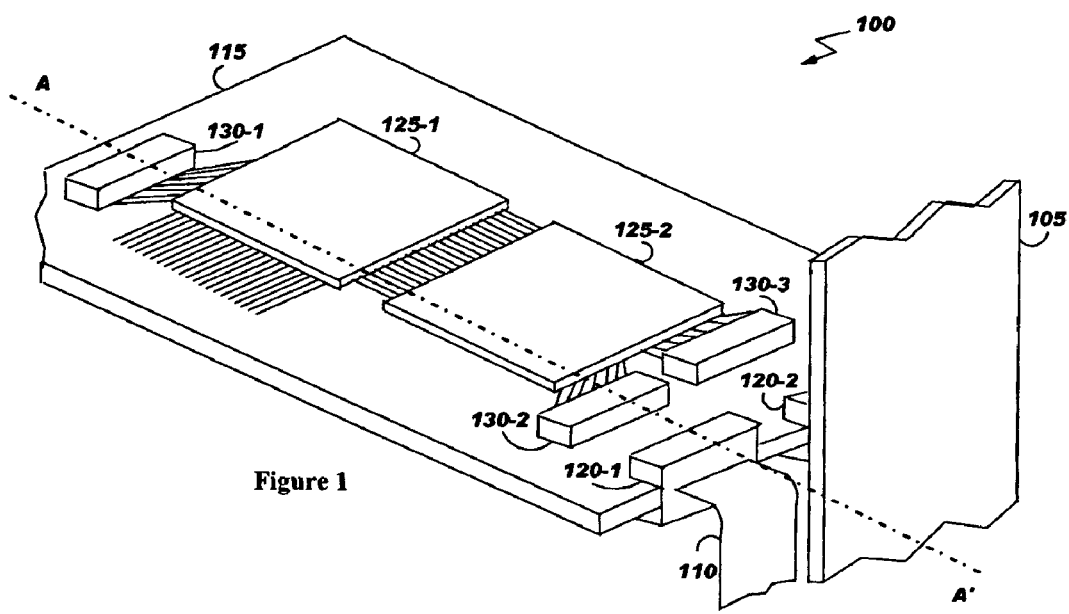
FIG. 1 illustrates a partial perspective view of an electro-optical system wherein the invention can be implemented.

FIG. 1 illustrates a partial perspective view of an electro-optical system 100, such as a server, a supercomputer or a telecom switch-router, wherein the invention may be implemented. For sake of illustration electro-optical system 100 consists in a rigid back-plane 105, a flexible back-plane 110, and a Printed Circuit Board (PCB) 115 connected to both back-planes 105 and 110 through optical connectors 120-1 and 120-2. PCB 115 comprises two semiconductor devices 125-1 and 125-2 and several electro-optical modules 130-1, 130-2, and 130-3. In this implementation example, optical signals are transmitted from electro-optical module 130-2 to electro-optical module 130-1, from electro-optical module 130-1 to optical connector 120-1, and from electro-optical module 130-3 to optical connector 120-2. Electro-optical modules 130-1, 130-2, and 130-3 are manufactured, aligned, and connected to PCB 115 according to the invention. Therefore, electro-optical module 130-1 combines a Vertical Cavity Surface-Emitting Laser and an optical signal detector, electro-optical modules 130-2 and 130-3 carry Vertical Cavity Surface-Emitting Laser. In general, each electro-optical module will contain an array of Vertical Cavity Surface-Emiting Lasers, an array of optical detectors or both. Such arrays are available on one die that contains either VCSEL's or detectors, where the VCSEL's and detectors have a well defined separation which is for example 250 µm. The VCSEL and detector arrays may be arranged in a one dimensional layout e.g., 1×4, 1×8, or 1×12, or a two dimensional layout e.g., 2×4 or 4×12.

Figure 2:
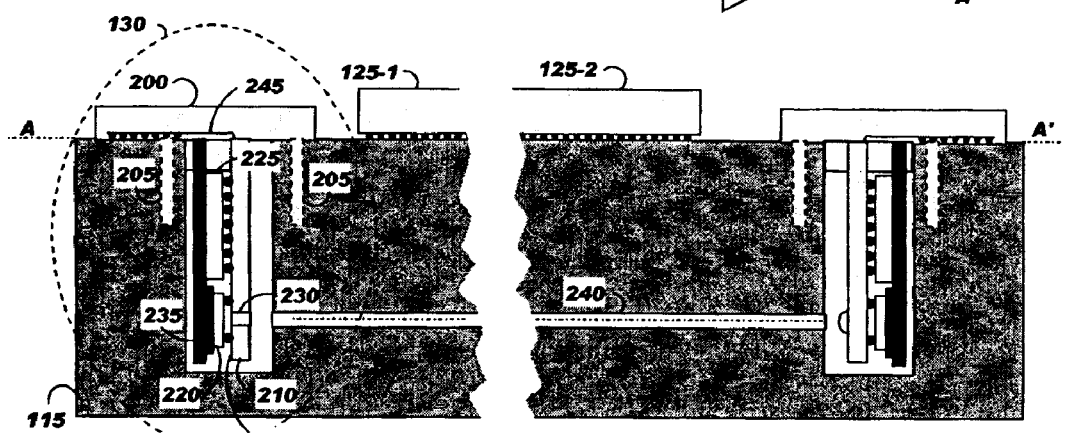
FIG. 2 is a partial cross section view of the printed circuit board represented on FIG. 1 wherein the invention is implemented.

FIG. 2 is a partial cross section view of the PCB 115 of FIG. 1, according to line A-A', illustrating the structure of electro-optical modules 130-1 and 130-2, generically referred to as 130, as well as the principles used for their alignment and connection. As shown, in a preferred embodiment, electro-optical module 130 comprises a holder 200 and a plurality of alignment pins 205 that fit to PCB holes so as to align electro-optical module 130 on PCB 115. Several dielectric and electrically conductive layers 215 are formed on one surface of the stiffener 210 of the electro-optical module 130. For example, the stiffener 210 can comprise one electrically conductive layer, sandwiched between two dielectric layers, wherein electrically conductive tracks are designed. In the example given on FIG. 2, the semiconductor devices of the electro-optical module 130 are soldered to pads belonging to this electrically conductive layer. The electro-optical module 130 comprises a surface emitting laser 220 and a driver 225 or an optical signal detector 220 and an amplifier 225. Naturally, stiffener 210 is either transparent, or translucent, so that optical signal can cross it, or comprises a waveguide 230. Still in a preferred embodiment, electro-optical module 130 further comprises a heat spreader and optical shielding part 235. Electro-optical module 130 is butt coupled to waveguide 240 designed in PCB 115. When electro-optical module 130 is inserted in PCB 115 and aligned, the optical signal emitted from or received to semiconductor device 220 is transmitted through waveguide 240. Electro-optical module 130 is electrically connected to PCB 115, using the set 245 of electrically conductive tracks and pads. The electrically conductive tracks and pads are implemented in a flexible cable to overcome the 90 degrees angle between the stiffener 210 and the surface of the PCB 115. In order to align the electro-optical module in the board, a two step process is preferably used:

a receptacle, or holder, is accurately positioned in the PCB based on the standard selective laser drilling concept, it may be inserted from the top or the bottom, the electro-optical module contains etched reference structures e.g., holes or trenches, that are the mirror of alignment features in the holder. A tight fit of the electro-optical module in the holder ensures precise alignment. Proper design enables multiple subsequent connections into the same holder.

Figure 3:
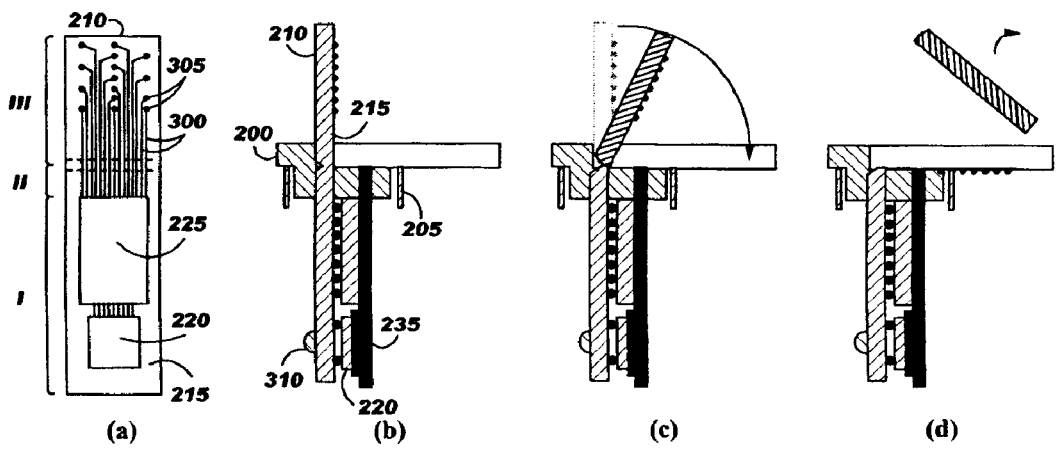
FIG. 3, comprising

FIG. 3, comprising FIGS. 3a, 3b, 3c, and 3d, illustrates an example of an electro-optical module 130 according to the invention. FIG. 3a is a front view of the module while FIGS. 3b, 3c, and 3d are side views of the module before its insertion, during its connection, and when it is installed, respectively. Printed circuit board is not shown for sake of clarity. The module stiffener 210 made of e.g., glass or silicon comprises one or more layer of dielectric materials and electrically conductive traces e.g., 300, to carry electrical signals, ending with pads e.g., 305. The electrically conductive circuit can also be covered by a further layer of dielectric material. In the specific embodiment the module at construction phase has three separate zones, one (I) for hosting devices, one (II) for the mechanical holder (alignment) and one (III) for the electrical connections. In a preferred embodiment, a groove is performed in the stiffener 210 between the second and third zones, as shown with dotted lines, so as to facilitate breaking of zone III of the stiffener 210. Such groove can be a pre-sawed channel. The electrically conductive traces and the pads of this third zone form a top flex-cable that is used to connect electro-optical module 130 to PCB 115.

In this example, the electro-optical and electrical elements are flip-chip bonded on to the pads in zone one of the module. The optical signals travel through the module substrate. consequently, the substrate must be transparent e.g., glass. For the case of glass substrate, the signals need preferably to be imaged through the glass using lenses in order to obtain a high optical coupling efficiency and to prevent optical cross-talk. The stiffener 210 can host optical lenses 310 and/or lenses can be milled in the glass itself.

Once the assembled optical module represented on FIGS. 3a and 3b is inserted and aligned into the PCB cavity, and held into position by holder 200 and alignment pins 205, the part of the stiffener corresponding to the third zone i.e., the part containing the top flex-cable, is bent down toward the mounting plane of the board as shown on FIG. 3c, allowing the electrical connection e.g., soldering, of the pads 305 through e.g., a standard hot-bar or laser process. The stiffener gets broken along the groove, or pre-sawed channel, and the stiffener portion can be removed, peeled-off, from the flex-cable section as shown on FIG. 3d.

Therefore, according to the invention, the path for high speed communication between the electronics hosted on the PCB and the micro-optical module (flex-cable) is the shortest.

Figure 4:
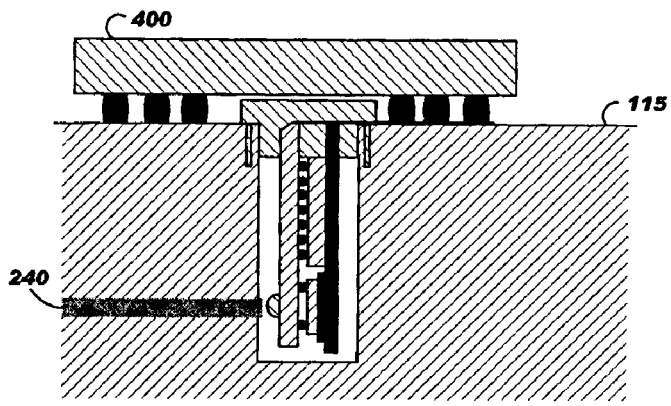
FIG. 4 shows the soldering of an electro-optical module flex-cable within the pads of a PCB that also hosts one or more electronic or electro-optical modules.

In another embodiment, the flex-cable is soldered within the pads of the PCB 115 that also host electronic or electro-optical module 400 as shown on FIG. 4. Such technique allows the high speed signal to travel along a single electrical media, avoiding impedance mismatch due to change of physical properties of the material surrounding the electrical conductor. The high speed signals are directly "injected" into the flex-cable as soon as possible, without the need to have the same signals travelling through different media and through different level of electrical interconnections prior to reach the optical active elements. This is possible thanks to openings in the dielectric top layer of the flat cable than can be achieved by standard laser processing e.g., the cable polymer is ablated away at the position of the copper pads and enables the exposed pads for further usage on soldering operations such as mounting an electronic modules on top of the flex portion of the electro-optical module.

Figure 5:
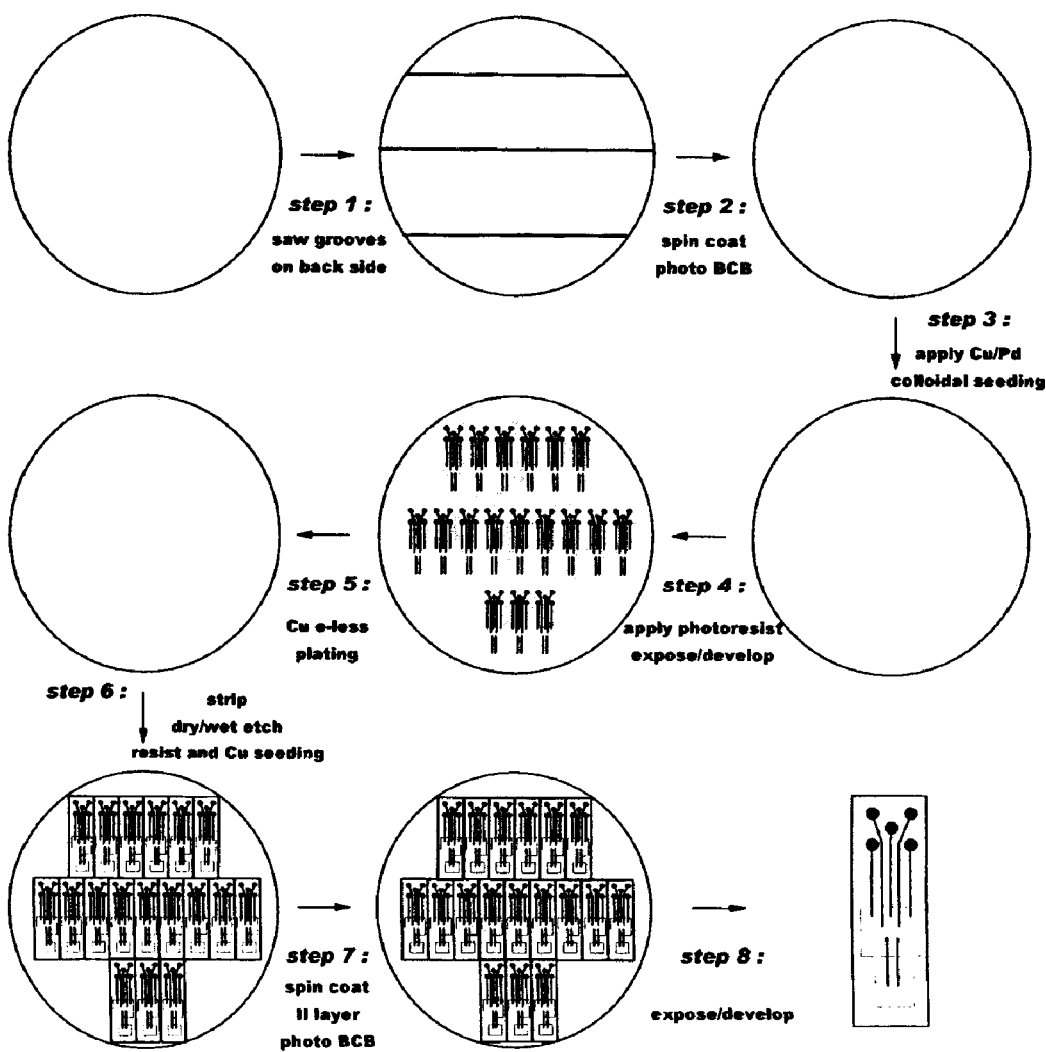
FIG. 5 illustrates an example of the steps of a process allowing the manufacturing of the electro-optical modules of the invention using standard semiconductor manufacturing tools and processes.

FIG. 5 illustrates an example of the steps of a process allowing the manufacturing of the described electro-optical modules of the invention with standard semiconductor manufacturing tools. In this example, the stiffener is made of glass and several electro-optical modules are manufactured in the same time on a single glass wafer. This process comprises the steps of, step 1: performing grooving on the backside of the glass wafer at predetermined positions according to the electro-optical module disposition design on the glass wafer, step 2: coating BenzoCycloButene (BCB) based Cyclotene 4026-46 (14 μm) on top side (Cyclotene is a trademark of the Dow Chemical Company), step 3: applying seeding layer to enable copper deposition, step 4: depositing and patterning resist on top of the seeding layer, step 5: electroless plating of copper, step 6: stripping resist, step 7: applying second layer of Cyclotene 4026-46, step 8: opening the top layer of Cyclotene 4026-46 at the positions of the copper pads.

Since the implementation of lenses is difficult and introduces critical alignment of the electro-optical module in the PCB, a preferable alternative is to use silicon substrate wherein transparency is obtained by realizing an optical waveguide through the silicon wafer. Compared to the use of glass substrate, the optical signals are geometrically separated which prevents optical cross-talk and yields good coupling efficiency through butt coupling. The through silicon waveguide can be formed as follow. First holes are etched through the silicon wafer, second the silicon wafer is oxidized which forms a silicon dioxide film that acts as a waveguide cladding. Finally, the holes is filled with an optically transparent waveguide material with a refractive index that is larger than that of silicon dioxide.

Figure 6:
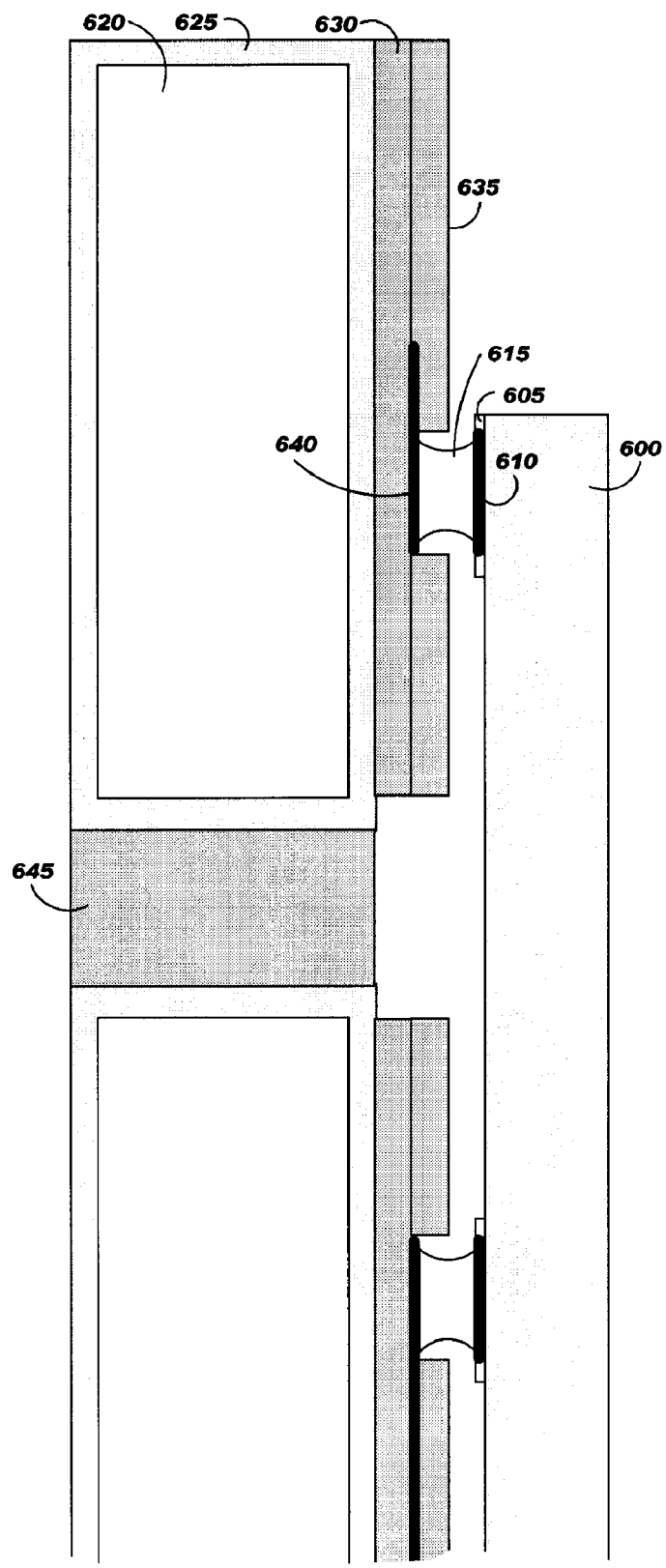
FIG. 6 shows a further embodiment illustrating the use of silicon for making the stiffener of the electro-optical modules of the invention.

FIG. 6 shows an example of this last embodiment, illustrating the use of silicon for making the stiffener. In such case, the light emitted by the VCSEL is guided through a polymer waveguide. For the case of a detector module, the basic layout is the same but the VCSEL is replaced by a detector. As shown, the VCSEL or detector 600 comprises Copper pads 610 on which solder 615 is applied. Pads 610 are surrounded by passivation layer 605. The stiffener 620 is made of silicon that external surface 625 is oxidized ($SiO_2$). The stiffener surface on which VCSEL or detector 600 is soldered is covered with two layers of BCB 630 and 635 wherein Copper pads 640 are designed for VCSEL or detector soldering. Copper pads 640 belong to the electrically conductive layer built on top of the first BCB layer 630 and protected by the second BCB layer 635. A polymer waveguide 645 is designed in the stiffener 620 to transmit light from the VCSEL to the PCB or from the PCB to the detector.

Another embodiment of the invention uses Liquid Crystal Polymers as dielectric in the different layers built-up in the electro-optical module.

The utilization of glass, silicon or alumina substrates offer a quite good thermal dimensional stability, greater than plastics or PCB materials that helps in maintaining precise alignment between the optical units. Glass allows to use laser soldering, silicon allows IR (laser) soldering of the flat cable solder joints on the board without affecting the whole assembly to thermal cycle (jeopardizing the optical elements alignment) due to the assembly materials "relative" thermal expansion properties.

The electro-optical module technology of the invention gives also the possibility to "mount first" the electro-optical module and test it before to place it on the product in place of mounting the loose components in a complex board with cavities and other passive optical devices (mirrors and fibers) with defects found at test requiring rework.

From an application point of view, the electro-optical module of the invention brings the following advantages:

the optoelectronic module is realized based on standard IC technology compatible process steps that offer a very good alignment precision (1 μm) of the opto-electronic components and alignment features for mounting the element in the printed circuit board.

the realization is preferably a wafer based process hence, many electro-optical modules can be manufactured simultaneously, bringing major cost savings.

the electro-optical module combines all required functions for the electro-optical or electro-optical conversion in one element hence, only one critical alignment step is required to position this element in the printed circuit board.

the opto-electronic and electronic components are flip-chip mounted on the glass or silicon substrate such that the light travels through the substrate. The glass or the silicon forms a well defined and accurately positioned interface with the waveguides on the printed circuit board. A separate heatsink can be bonded on to the opto-electronic and electronic components without affecting the optical coupling section.

the electrical flex-cable bypasses the need for an optical turning mirror. Consequently, the optical coupling is simplified which potentially leads to a higher optical coupling efficiency between the optical pin and the waveguides on the printed circuit board.

the electro-optical module concept can be used for multilayer waveguide systems i.e., several waveguide layers on top of each other.

While the description is based upon Vertical Cavity Surface-Emitting Laser (VCSEL) and the associated optical signal detector that require the use of transparent material, translucent material, or opaque material comprising light waveguide, it must be understood that the invention can be implemented with other kinds of light emitting and receiving devices that do not require such stiffener material characteristics. For example, it is possible to implement the invention with optical signal detector device that light emitting or sensible surface is located at the opposite side of the electrical connectors e.g., pads.

Naturally, in order to satisfy local and specific requirements, a person skilled in the art may apply to the solution described above many modifications and alterations all of which, however, are included within the scope of protection of the invention as defined by the following claims.

What is claimed is:

1. An electro-optical module adapted to be connected to a printed circuit board, said electro-optical module comprising an optically transparent glass stiffener with at one electrically conductive trace, and at least one lens adapted to focus at least one light beam transferred through said stiffener, characterized in that a portion of said stiffener, comprising a portion of said at least one electrically conductive trace, is removable from said module and said trace and said trace is adapted to establish an electrical contact between said electro-optical module and said printed circuit board.

2. The electro-optical module of claim 1 further comprising a holder adapted to align and maintain said electro-optical module in said printed circuit board.

3. The electro-optical module of claim 1 wherein said portion of said stiffener is breakable along a preformed groove.

4. The electro-optical module of claim 1 further comprising a heat spreader.

5. The electro-optical module of claim 4 wherein said heat spreader being optionally adapted to shield light.

* * * * *